(12) United States Patent
Ishii

(10) Patent No.: US 6,627,936 B2
(45) Date of Patent: Sep. 30, 2003

(54) SEMICONDUCTOR DEVICE AND METHOD OF PRODUCING THE SAME

(75) Inventor: Yoshio Ishii, Tateyama (JP)

(73) Assignee: UMC Japan (JP)

( * ) Notice: Subject to any disclaimer, the term of this patent is extended or adjusted under 35 U.S.C. 154(b) by 0 days.

(21) Appl. No.: 10/097,789

(22) Filed: Mar. 13, 2002

(65) Prior Publication Data

US 2002/0185707 A1 Dec. 12, 2002

(30) Foreign Application Priority Data

Jun. 7, 2001 (JP) .................................. 2001-172211

(51) Int. Cl.[7] ................... H01L 27/108; H01L 29/76; H01L 29/94; H01L 31/119
(52) U.S. Cl. .................... 257/296; 257/303; 257/306
(58) Field of Search ...................... 257/296, 300, 257/303, 306, 311, 532; 438/239, 250, 253, 393, 396, 397

(56) References Cited

U.S. PATENT DOCUMENTS

| 4,931,897 A | * | 6/1990 | Tsukamoto et al. | ......... 361/313 |
| 5,751,035 A | * | 5/1998 | Kameda et al. | ............. 257/300 |
| 5,972,722 A | * | 10/1999 | Visokay et al. | ................ 438/3 |
| 6,373,083 B1 | * | 4/2002 | Oh | ............................. 257/296 |

FOREIGN PATENT DOCUMENTS

| JP | 06-133639 | 5/1994 |
| JP | 06-257537 | 9/1994 |

* cited by examiner

Primary Examiner—Wael Fahmy
Assistant Examiner—Hoai Pham
(74) Attorney, Agent, or Firm—Richard P. Gilly, Esquire; Wolf, Block, Schorr and Solis-Cohen, LLP

(57) ABSTRACT

A semiconductor device having a silicon substrate 1 and a second electrode layer 7 directly connected with each other, and a plural number of capacitors positioning a first insulating layer 8 and a second insulating layer 6 between a first electrode layer 5 and a second electrode layer 7 and between the first electrode layer 5 and the silicon substrate 1

1 Claim, 10 Drawing Sheets

SEMICONDUCTOR DEVICE AND METHOD OF PRODUCING THE SAME

BACKGROUND OF THE INVENTION

This invention relates to semiconductor device having a simple structure and a method of producing the same.

FIG. 10 is a sectional view for showing a structure of a conventional semiconductor device.

In the conventional semiconductor device, a first insulating layer 12 is formed on a silicon substrate 11, and first electrode layers 13, comprised of first polysilicon film, are provided at predetermined portions of this first insulating layer 12, as shown in FIG. 10. And, a second insulating layer 14 is formed on respective upper faces and respective side faces of the first electrode layers 13, and a second electrode layer 15, comprised of a second polysilicon film, is provided on the upper face of this second insulating layer 14 so as to form semiconductor device 16.

In the semiconductor device 16 as shown in FIG. 10, the second insulating layer 14 intervenes between the first electrode layer 13 and the second electrode layer 15.

Besides, the first electrode layer 13 is connected with a power terminal (not shown) and the second electrode layer 15 is connected with a terminal the same as the silicon substrate 11 by a means (not shown) so as to form a plurality of capacitors between the first electrode layer 13 and the second electrode layer 15 and between the first electrode layer 13 and the silicon substrate 11.

In the conventional semiconductor device, the whole of the upper face and the side faces of the first electrode layer 13 comprising the first polysilicon film is not covered by the second electrode layer 15 comprising the second polysilicon film through the second insulating layer 14. Then, the capacity of the capacitor comprising the first electrode layer 13, the silicon substrate 11 and the second electrode layer 15 through the first insulating layer 12 and the second insulating layer 14 is not always sufficient.

For reasons of intervention of the first and the second insulating layers 12, 14 between the silicon substrate 11 and the second electrode layer 15 comprised of polysilicon film, it is necessary to perform conductive connection between the silicon substrate 11 and the second electrode layer 15, and there is a problem in its responsibility thereby.

The present invention is for solving such conventional problems, and the object of the present invention is to provide semiconductor device having a simple structure, small area to be occupied, and good response characteristic, and method of producing the same.

SUMMARY OF THE INVENTION

A first invention is the invention of semiconductor device, comprising a semiconductor substrate and a first insulating layer formed on said semiconductor substrate, a first electrode layer formed at a predetermined portion on said first insulating layer, a second insulating layer formed covering side faces and an upper face of said first electrode layer, and a second electrode layer formed covering said second insulating layer, comprising:

said second electrode layer formed covering side faces of said first insulating layer and side faces and an upper face of said second insulating layer;

said second electrode layer directly connected with said semiconductor substrate; and capacitors formed between said first electrode layer and said second electrode layer and between said first electrode layer and said semiconductor substrate.

According to the first invention, capacitors can be formed, making use of the whole periphery of the first electrode layer, and the surface area of the first electrode layer can be effectively applied to the capacitors, thereby. Then, the occupied area of the semiconductor device can be made smaller with the same electric capacity, and the capacitor having more capacity can be formed with the same area.

Besides, the second electrode layer is directly connected with the semiconductor substrate. Then, the conductive portion to be used for connection between the semiconductor substrate and the second electrode layer is unnecessary, lower resistance connection is possible, and its responsibility can be improved.

A second invention is the invention of method of producing semiconductor device, comprising:

a routine of forming a first insulating layer portion on a semiconductor substrate;

a routine of forming a first polysilicon film on said first insulating layer portion;

a routine of providing masks on predetermined positions of an upper face of said first polysilicon film and forming a plurality of first electrode layers by etching;

a routine of forming a second insulating layer portion on an upper face and side faces of said first electrode layer;

a routine of providing a mask with respect to said second insulating layer portion on an upper face of said first electrode layer and said second insulating layer portion and etching;

a routine of removing unnecessary portions of said second insulating layer portion and said first insulating layer portion by etching so as to expose said semiconductor substrate and forming a plurality of second insulating layers in a U shape each covering said first electrode layer; and a routine of forming a second polysilicon film on said semiconductor substrate exposed, side faces of each said first insulating layer and side faces and an upper face of said second insulating layer so as to make a second electrode layer.

According to the second invention, the semiconductor device having the effects shown in the first invention can be produced.

DESCRIPTION OF THE PREFERRED EMBODIMENTS

FIGS. 1 through 9 are sectional views for each showing an example of a routine at the time of producing semiconductor device according to the present invention.

Figure 1:
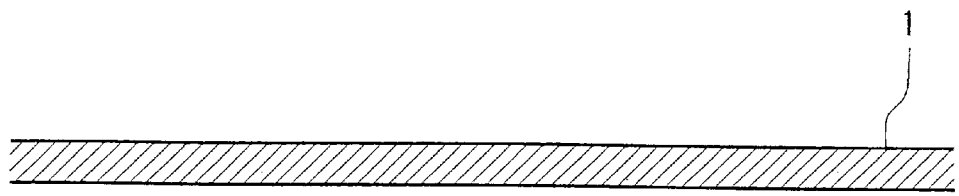
FIG. 1 is a sectional view for showing an example of a routine at the time of producing semiconductor device according to the present invention.
Figure 2:
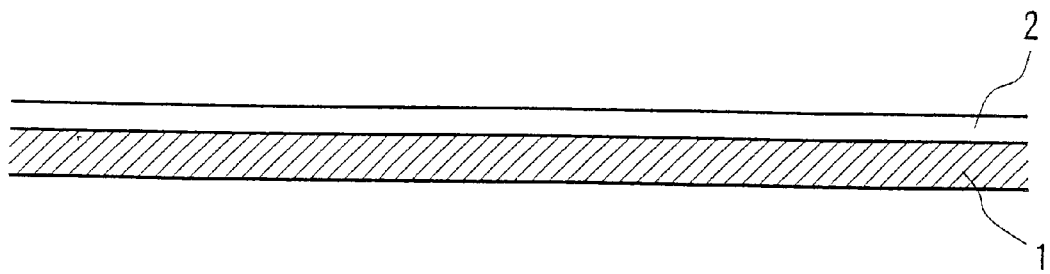
FIG. 2 is a sectional view for showing an example of a routine at the time of producing semiconductor device according to the present invention.
Figure 3:
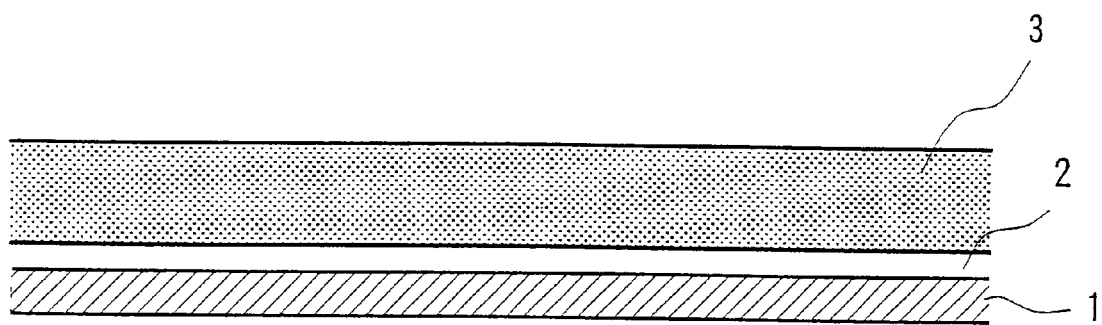
FIG. 3 is a sectional view for showing an example of a routine at the time of producing semiconductor device according to the present invention.
Figure 4:
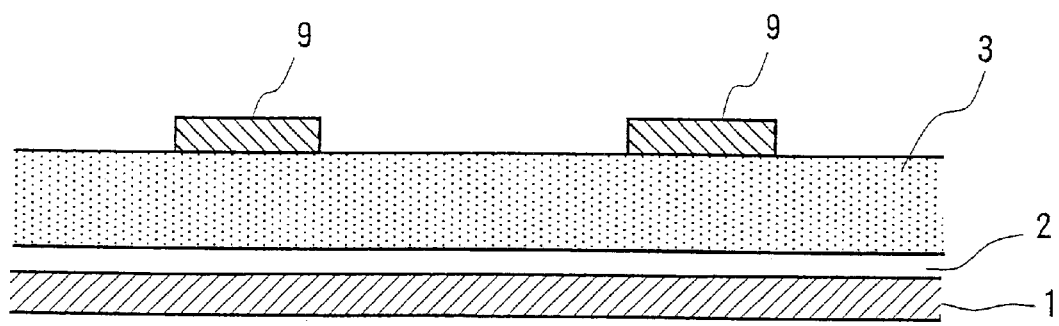
FIG. 4 is a sectional view for showing an example of a routine at the time of producing semiconductor device according to the present invention.
Figure 5:
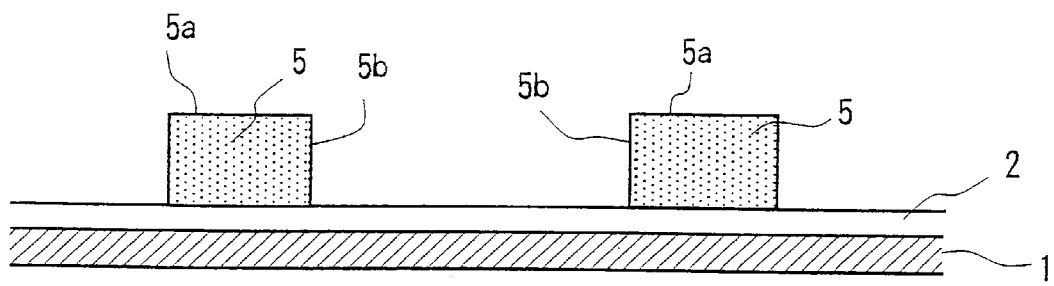
FIG. 5 is a sectional view for showing an example of a routine at the time of producing semiconductor device according to the present invention.

In order to produce semiconductor device, which is an embodiment of the present invention, a first insulating layer portion 2, comprised of an insulating film, is formed on a silicon substrate 1 so as to have equal thickness, as shown in FIGS. 1 and 2. On this first insulating layer portion 2, a first polysilicon film 3 is formed so as to have equal thickness in a similar way, as shown in FIG. 3. Thereafter, masks 9 are provided on predetermined positions of the upper face of this first polysilicon film 3 at predetermined intervals as shown in FIG. 4, and etching is performed so as to form a plurality of first electrode layers 5 comprised of a polysilicon film on the first insulating layer portion 2, as shown in FIG. 5.

Figure 6:
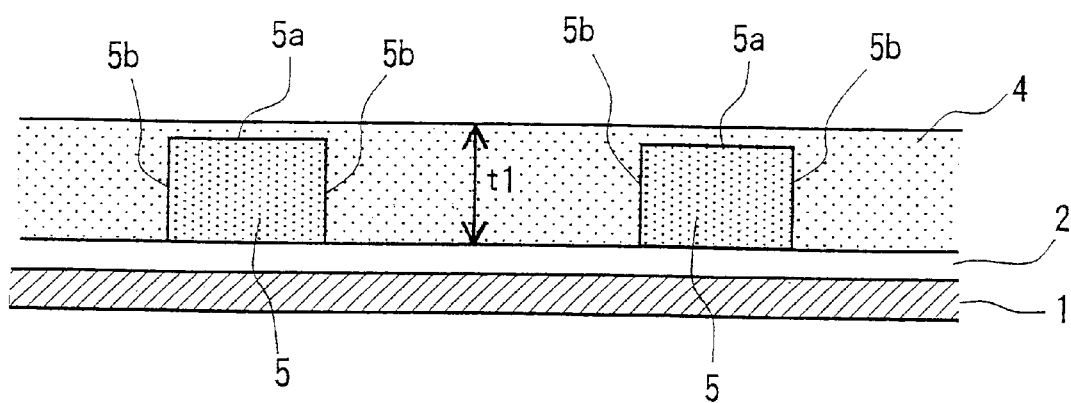
FIG. 6 is a sectional view for showing an example of a routine at the time of producing semiconductor device according to the present invention.
Figure 7:
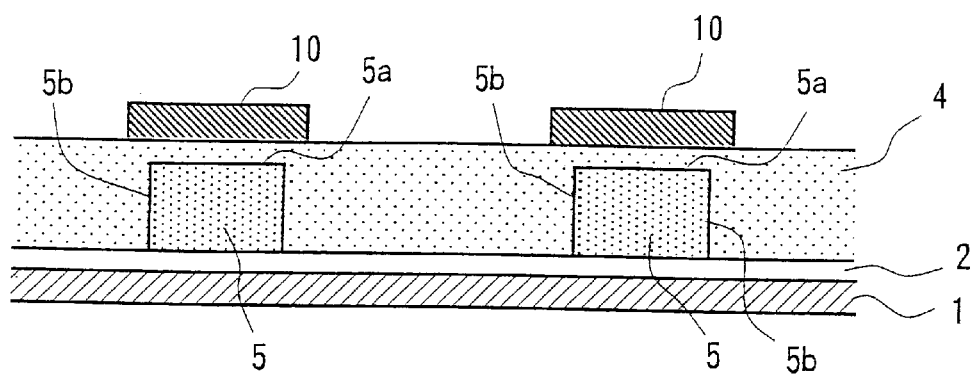
FIG. 7 is a sectional view for showing an example of a routine at the time of producing semiconductor device according to the present invention.
Figure 8:
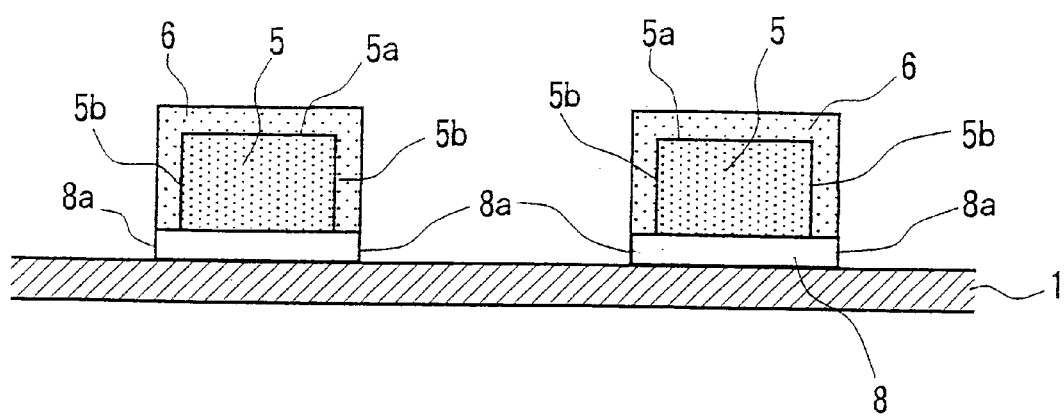
FIG. 8 is a sectional view for showing an example of a routine at the time of producing semiconductor device according to the present invention.

Subsequently, the whole upper face 5a and the whole side faces 5b, 5b of this first electrode layer 5 are covered by a second insulating layer portion 4 having a predetermined thickness t1 from the first insulating layer portion 2, as shown in FIG. 6. Thereafter, masks 10, which are wider than the first electrode layer 5, are provided at positions corresponding to the first electrode layers 5 on the upper face of the insulating layer portion 4, as shown in FIG. 7, and etching is performed till the silicon substrate 1 is exposed. Then, the second insulating layer portion 4 and the first insulating layer portion 2 are removed excluding the portion covered by the masks 10, and a plurality of second insulating layers 6 having U-shape formed out of the second insulating layer portion 4 and a plurality of first insulating layers 8 formed out of the first insulating layer 2 remain and are formed, as shown in FIG. 8. Then, a plural number of first electrode layers 5 on the first insulating layers 8 are formed on the substrate 1, covering their upper faces 5a and the side faces 5b, 5b by the second insulating layers 6.

Figure 9:
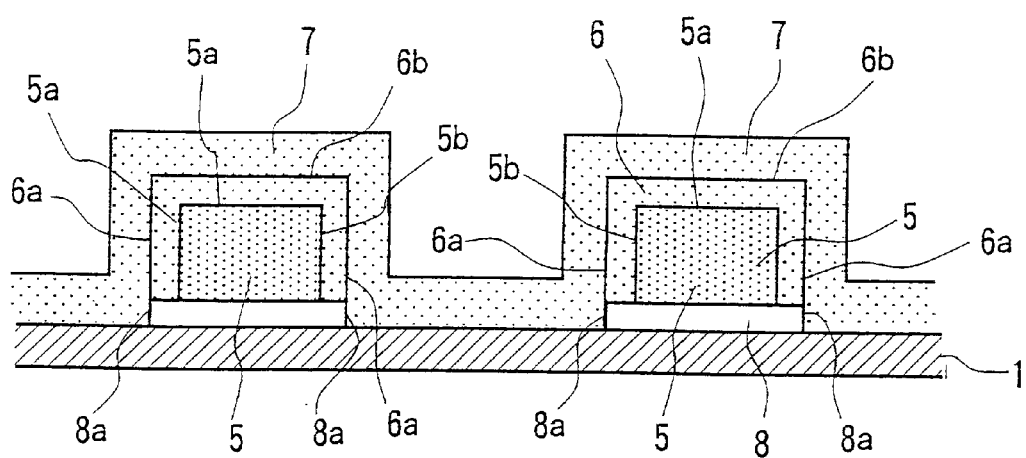
FIG. 9 is a sectional view for showing an example of a routine at the time of producing semiconductor device according to the present invention.
Figure 10:
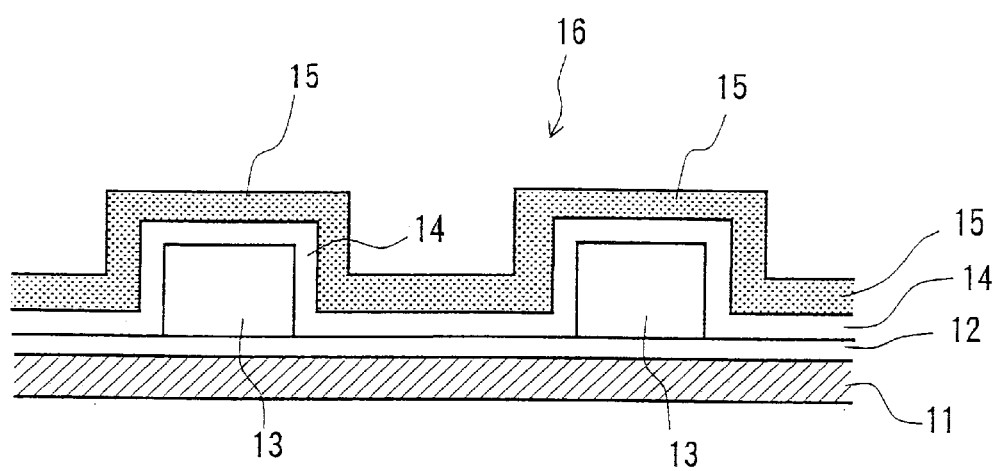
FIG. 10 is a sectional view for showing a structure of a conventional semiconductor device.

Subsequently, the second polysilicon film is unevenly formed along the sectional contours of the second insulating layer 6, the first insulating layer 8 and the silicon substrate 1, covering the surfaces of side faces 6a, 6a and an upper face 6b of the second insulating layer 6, side faces 8a, 8a of the first insulating layer 8 and the silicon substrate 1, with such a state that the second insulating layer 6, the side faces 8a, 8a of the first insulating layer 8 and the silicon substrate 1 are exposed on the surface so as to form a second electrode 7, as shown in FIG. 9.

At the result, the silicon substrate 1 and the second electrode layer 7 are formed and conductively directly connected with each other in the portion where the first electrode layer 5 is not formed, as clear from FIG. 9. And, a plural number of capacitors are formed, having the first insulating layer 8 and the second insulating layer 6 between the first electrode layer 5 and the silicon substrate 1 and between the first electrode layer 5 and the second electrode 7.

The present invention is explained on the basis of the embodiment heretofore. The embodiments which are described in the present specification are illustrative and not limiting. The scope of the invention is designated by the accompanying claims and is not restricted by the descriptions of the specific embodiments. Accordingly, all the transformations and changes belonging to the claims are included in the scope of the present invention.

What is claimed is:

1. Semiconductor device comprising a semiconductor substrate and a first insulating layer formed on said semiconductor substrate, a first electrode layer formed at a predetermined portion on said first insulating layer, a second insulating layer formed covering side faces and an upper face of said first electrode layer, and a second electrode layer formed covering said second insulating layer, comprising:

said second electrode layer formed covering side faces of said first insulating layer and side faces and an upper face of said second insulating layer;

said second electrode layer directly connected with said semiconductor substrate; and capacitors formed between said first electrode layer and said second electrode layer and between said first electrode layer and said semiconductor substrate.

* * * * *